United States Patent [19]

Sizer, II et al.

[11] Patent Number: 5,416,872
[45] Date of Patent: May 16, 1995

[54] ARRANGEMENT FOR INTERCONNECTING AN OPTICAL FIBER AN OPTOELECTRONIC COMPONENT

[75] Inventors: Theodore Sizer, II, Little Silver; James A. Walker, Howell, both of N.J.

[73] Assignee: AT&T Corp., Murray Hill, N.J.

[21] Appl. No.: 88,688

[22] Filed: Jul. 6, 1993

[51] Int. Cl.⁶ .............................................. G02B 6/36
[52] U.S. Cl. ........................................ 385/92; 385/88; 385/89
[58] Field of Search .................................... 385/88-94

[56] References Cited

U.S. PATENT DOCUMENTS

| | | | |
|---|---|---|---|
| 3,829,316 | 8/1974 | Huber et al. | 96/36.2 |
| 3,968,564 | 7/1976 | Springthorpe | 385/38 |
| 4,038,488 | 7/1977 | Lin | 174/52 |
| 4,245,273 | 1/1981 | Feinberg et al. | 361/382 |
| 4,462,534 | 7/1984 | Bitaillou et al. | 228/180 |
| 4,826,272 | 5/1989 | Pimpinella et al. | 385/93 X |
| 5,040,868 | 8/1991 | Waitl et al. | 385/33 |
| 5,247,596 | 9/1993 | Maignan et al. | 385/88 |
| 5,247,597 | 9/1993 | Blacha et al. | 385/88 |

OTHER PUBLICATIONS

M. A. Zimmerman, "Protecting Multichip Modules With Molded Packaging", Elecrtronic Packaging & Production, Oct. 1991.

*Primary Examiner*—Rodney B. Bovernick
*Assistant Examiner*—Phan Thi Heartney
*Attorney, Agent, or Firm*—John A. Caccuro

[57] ABSTRACT

An apparatus enables an optical fiber mounted through a hole in one side of a substrate to couple optical signals to and from an optoelectronic component mounted on the other side of the substrate. A connector is formed using the above apparatus by adding electrical terminals which connect to wiring paths on the substrate and to the optoelectronic component mounted thereon. In one connector arrangement, the electrical terminals are mounted orthogonal to the optical fiber. In another connector arrangement, the electrical terminals are mounted essentially in-line with the optical fiber. Both connector arrangements can accommodate one or more optical fibers and connect to one or more electrical terminals.

6 Claims, 7 Drawing Sheets

ARRANGEMENT FOR INTERCONNECTING AN OPTICAL FIBER AN OPTOELECTRONIC COMPONENT

RELATED APPLICATION

Related subject matter is disclosed in the following application filed concurrently herewith and assigned to the same Assignee hereof: U.S. patent application Ser. No. 08/088,684, filed Jul. 6, 1993 and entitled "Optical Fiber Connective Device and Its Method of Assembly," inventors Theodore Sizer, II and James Albert Walker.

TECHNICAL FIELD

The present invention relates to optical fiber connection arrangements and, more particularly, to a method and apparatus for interconnecting optical fiber and an optoelectronic component.

BACKGROUND OF THE INVENTION

The past decade has illustrated that the use of optical fiber as an information transport medium allows for rugged, high speed, noise immune, low power data communication over long distances. Even though coaxial cable and fiber are comparable in cost per foot, optical fiber has not been accepted for short to medium haul applications due to the high cost of the connections on the fiber ends. The high connector cost is due to two separate connector requirements. First, since electrical connections are required at both ends of a datalink, the fiber ends must be precisely aligned to the optical signal emitter and detector. Second, although there are experiments being performed to develop Gallium Arsenide (GaAs) on Silicon (Si) and fluorescent Si, emitters are currently made from discrete III–V materials (either LEDs or lasers). Since the signal drivers and receiving amplifiers, which are inevitably required in such arrangements, need to be made from Si circuitry, there is a need that dissimilar semiconductor devices be combined in a single connector package. Thus, there is a continuing need to improve the technology for interconnecting optical fibers to optoelectronic components.

SUMMARY OF THE INVENTION

The present invention provides an improved optical fiber to optoelectronic component connection apparatus which enables an optical fiber to be mounted through a hole in a first surface of a substrate such that optical signals are coupled onto a flip-chip type optoelectronic component which is mounted on a second surface of the substrate. More particularly, the apparatus includes a first surface of a substrate having a plurality of electrical paths and contact pads (e.g., solder bumps) thereon for mounting a flip-chip type optoelectronic component, said substrate including a hole formed between a second surface and the first surface of the substrate, the hole being used to accept an optical fiber. The optoelectronic component includes a plurality of contact pads for mounting to matching contact pads on said plurality of electrical paths on said substrate. The optoelectronic component is aligned over the hole to couple optical signals to and from the optical fiber that is mounted through the hole in the substrate. Another apparatus enables an N optical fiber ribbon cable to be mounted through N holes in the substrate to couple signals to one or more optoelectronic components mounted on the substrate.

According to another embodiment, a connector apparatus includes a substrate having a plurality of electrical paths onto which is mounted at least one flip-chip type optoelectronic component. The substrate includes a hole formed between a second surface and a first surface of the substrate, the hole being used to accept the optical fiber. The optoelectronic component includes is aligned over the hole to couple optical signals to and from the optical fiber mounted through the hole in the substrate. One or more electrical contacts connected to one or more electrical paths of the substrate, are used for communicating electrical signals to and from the optoelectronic component. According to one connector, the one or more electrical contacts are mounted in line with the optical fiber and arranged, respectively, to make connection with one or more contacts on the edge of a printed circuit board. According to yet another connector embodiment, one or more electrical contacts are aligned with the substrate and orthogonal to the optical fiber mounted to the substrate.

DETAILED DESCRIPTION

The drawings of the various figures are not necessarily to scale and contain dimensional relationships (e.g., angles) which are exaggerated to aid in the clarity of the description.

Figure 1:
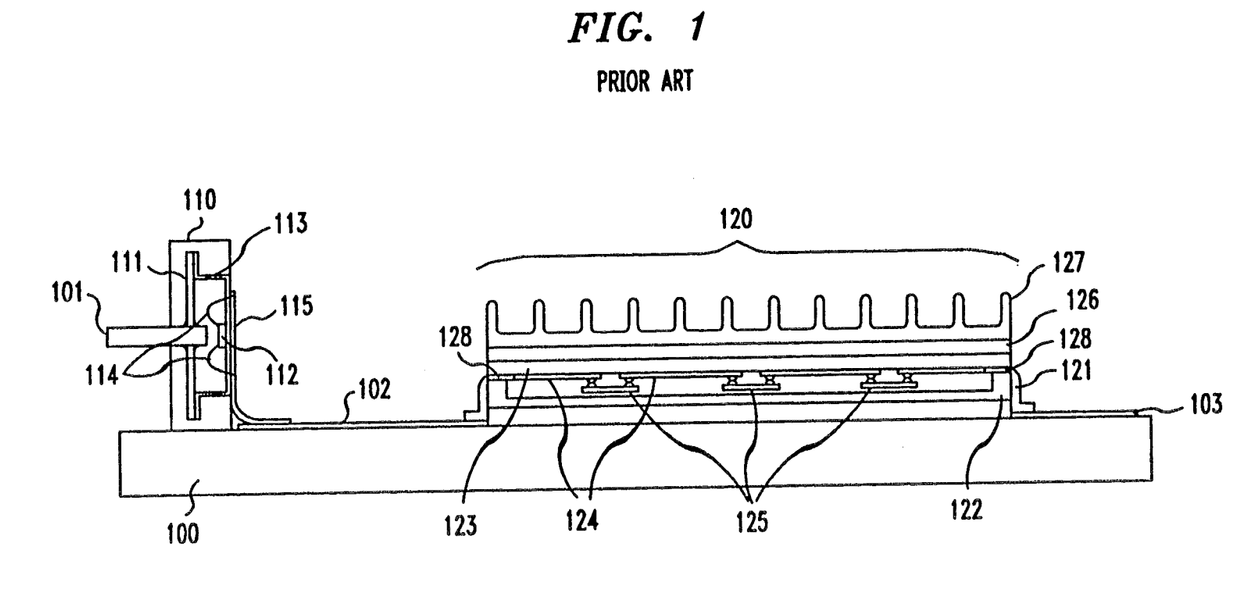
FIG. 1 shows a prior art optical fiber interconnection to a multichip module mounted on a printed circuit board.

Shown in FIG. 1 is a prior art arrangement for interconnecting an optical fiber 101 with a multichip module 120 that is mounted on a printed circuit (PC) board 100. The optical fiber 101 connects to optoelectronic circuit 110 that is wired to printed circuit board 100. The optoelectronic circuit 110 connects via various wire paths, for example 102, to multichip module 120.

The optoelectronic circuit 110 includes plate 111 that has a hole for mounting optical fiber 101 that is then epoxied to plate 111. The optoelectronic chip 112 is glued or epoxied to bracket 113. The bracket 113 is then aligned with plate 111 so as to optimize optical signal coupling between optical fiber 101 and optoelectronic chip 112. When optical signal transfer between the optical fiber 101 and optoelectronic chip 112 has been optimized bracket 113 is spot-welded to plate 111. The leads 114 of optoelectronic chip 112 connect to wire frame 115. Wire frame 115 enables the optoelectronic circuit 110 to be soldered to wire path 102 of PC board 100. The optoelectronic chip 112 can include an LED or laser as a transmitting device and, as a receiving device, include an optical detector. Additionally, in other prior art arrangements optoelectronic chip may include other signal drivers and signal processors. Finally, all these components of the optoelectronic circuit 110 are molded together in a plastic housing.

Multichip modules 120 are a known packaging technology which allows for several semiconductor chips 125 to be interconnected on a high-density substrate 123 in a single package. One such multichip module arrangement is described in the article written by M. A. Zimmerman, AT&T Bell Laboratories, entitled "Protecting Multichip Modules With Molded Packaging," and published in *Electronic Packaging and Production*, on October 1991 and incorporated by reference herein. These modules 120 may often contain ASICs and RAM circuits which require complex and high density interconnect routings as well as discrete components such as filter capacitors. The advantages of this technology are the reduction in physical size, improvement in system performance (due to faster chip-to-chip transmission on the module substrate) and the ability to mix dissimilar components on a common substrate. The semiconductor (IC) chips 125 may be bonded to substrate 123 through the use of wire bond, TAB or flip chip connections.

The multichip module 120 of FIG. 1 includes a module frame 122 that is made of molded plastic and includes a wire frame 121 that enables multichip module 120 to connect to wire paths 102 and 103 of PC board 100. Multichip module 120 also includes a ceramic substrate 123 that has various wire paths 124 etched thereon to interconnect to the various integrated circuits 125. The integrated circuits 125 are, illustratively, shown to connect using solder bumps to the wire paths 124 in a well-known manner that will be described in a later paragraph.

Ceramic substrate 123 includes contacts 128 which connect wire paths 124 to wire frame 121 when substrate 123 is placed in the plastic lead frame 122. The wire frame 121 is usually reflow-solder connected to the contacts 128 of wire paths 124 of ceramic substrate 123. A heat spreader 126 abuts the ceramic substrate 123 and is used to couple heat from the ceramic substrate 123. Heat sink 127 is placed on top of heat spreader 126 and is used to dissipate the heat generated by integrated circuits 125 on ceramic substrate 123.

In operation, optical signals are received over optical fiber 101 and optoelectronic circuit 110 converts the signals from an optical to an electrical signal which is then coupled via wire paths 102 and wire frame 121 to wire path 124 and integrated circuits 125 for processing.

Figure 2:
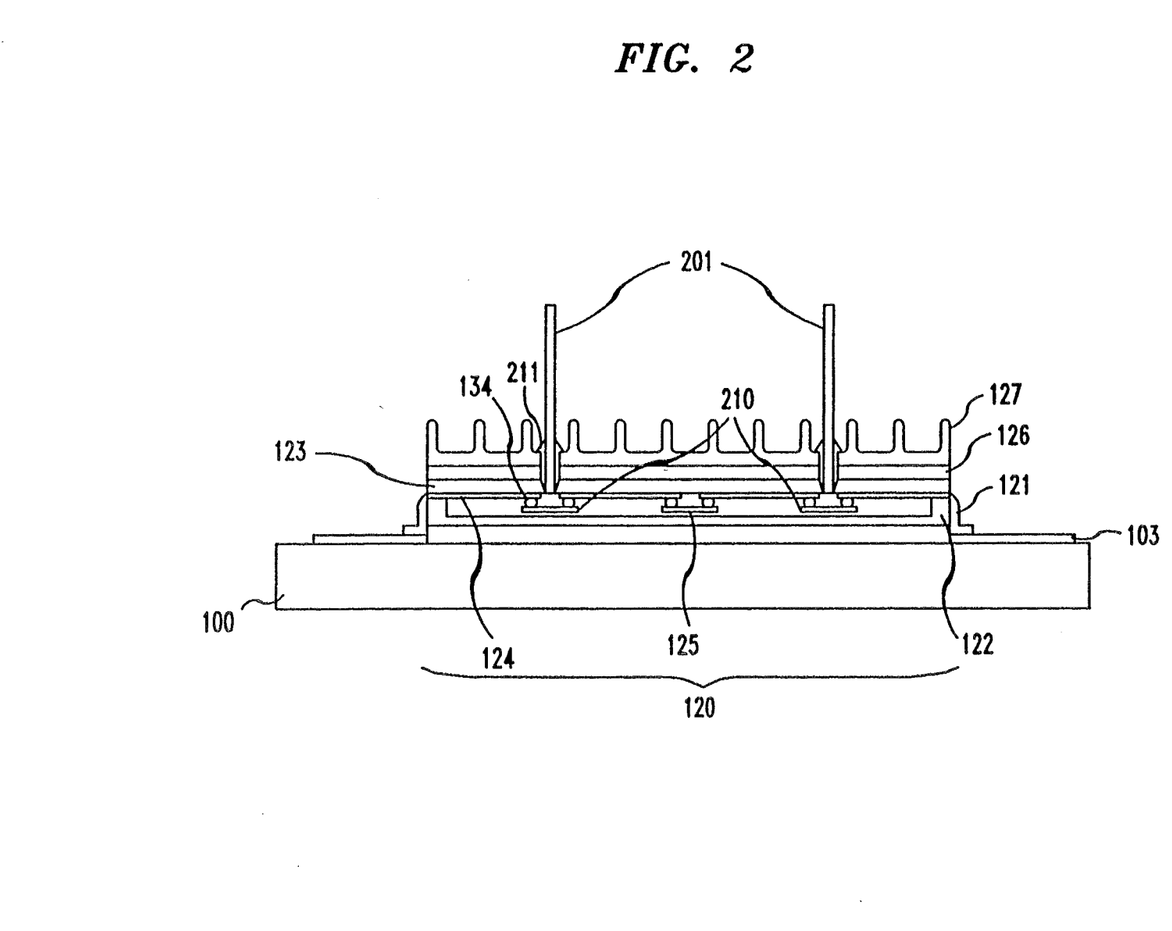
FIG. 2 shows one embodiment of an optical fiber interconnection to a multichip module in accordance with the present invention.

With reference to FIG. 2 we show one embodiment of an optical fiber interconnection to a multichip module package, in accordance with the present invention. In such an arrangement, optical fibers, for example 201, are connected through heat sink 127, heat spreader 126 and substrate 123 to reach integrated circuit 210. For convenience, each optical fiber is shown with its outside cladding. The optical fibers 201 are then epoxied or glued 211 in place. The integrated circuit 210 is an optoelectronic chip. In accordance with the present invention, optical signals received or transmitted over optical fiber 201 are coupled to/from optoelectronic chip 210 where they are converted to electrical signals. The optical fiber 201 is aligned with optoelectronic chip 210 to optimize optical signal coupling.

Flip-chip bonding allows for the direct application of semiconductor or integrated circuit chips 125 to substrate 123 with accurate alignment capabilities. In order to attach a chip to a substrate using flip-chip bonding techniques, the contact pads on each device need to be matched, solder applied and then flowed to provide approximately hemispherical bumps. The chip is flipped and placed upon the mating substrate. The solder is then reflowed to ensure a secure electrical and physical connection. As the solder is being reflowed, however, surface tension effects in the molten solder cause the opposing contact pads to become aligned with high precision. This precision is exploited by the present invention to provide optical alignment between optical fiber 201 and chip 210. However, while the present invention has been described as using solder bump-type contact pads, other electrically conductive materials such as solder paste, indium plugs or anisotropic materials may be utilized as contact pads.

Advantageously, the arrangement of FIG. 2 enables optical signals to be received and transmitted over optical fiber 201 directly to optoelectronic chip 210 of multichip module 120. By shortening the connection path between optoelectronic chip 210 and the other integrated circuit chips 125 of multichip module 120 it is expected that multichip module 120 operating speeds can be further increased. In accordance with the present invention, one or more such optical fibers 201 can be made to interconnect to multichip module 120.

Figure 3:
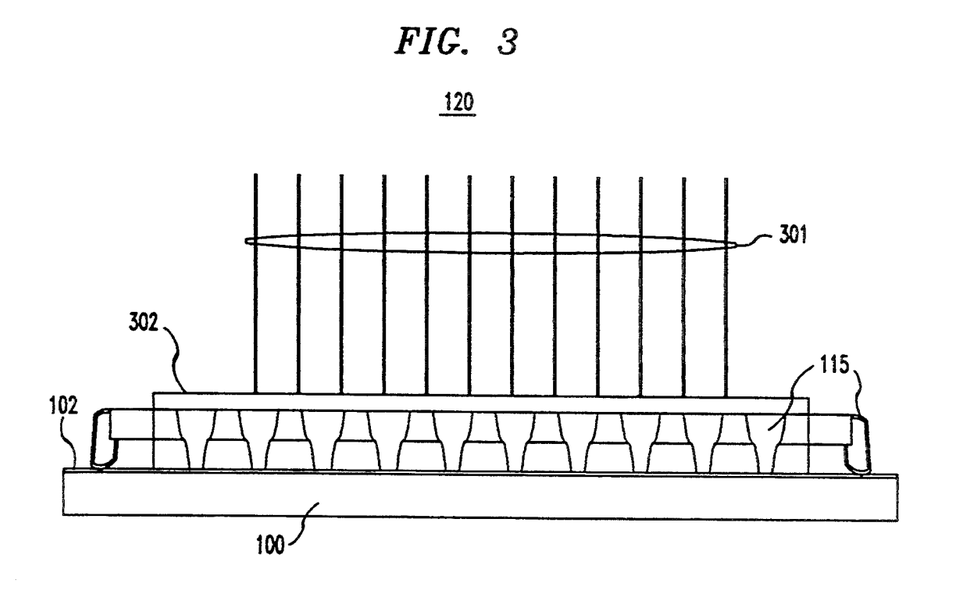
FIG. 3 shows an optical fiber ribbon cable connection to a multichip module in accordance with another aspect of the present invention.

With reference to FIG. 3 there is shown how a 12-optical fiber ribbon cable can be interconnected to a multichip module 120. In such an arrangement, each of the optical fibers in the ribbon cable terminates at a detector or transmitter optoelectronic chip 210 of multichip module 120. The multichip module 120 shown in FIG. 3 does not include the heat sink 127 illustrated in FIG. 2. Instead, a plastic top 302 is molded as the top of multichip module 120. It should be understood, however, that if the heat sink 127 shown in FIG. 2 was needed for multichip module 120, then a multifiber cable can be arranged to pass through such a heat sink 127 and connect to the optoelectronic chips 210 on ceramic substrate 123 in the same manner as previously described in FIG. 2.

Figure 4:
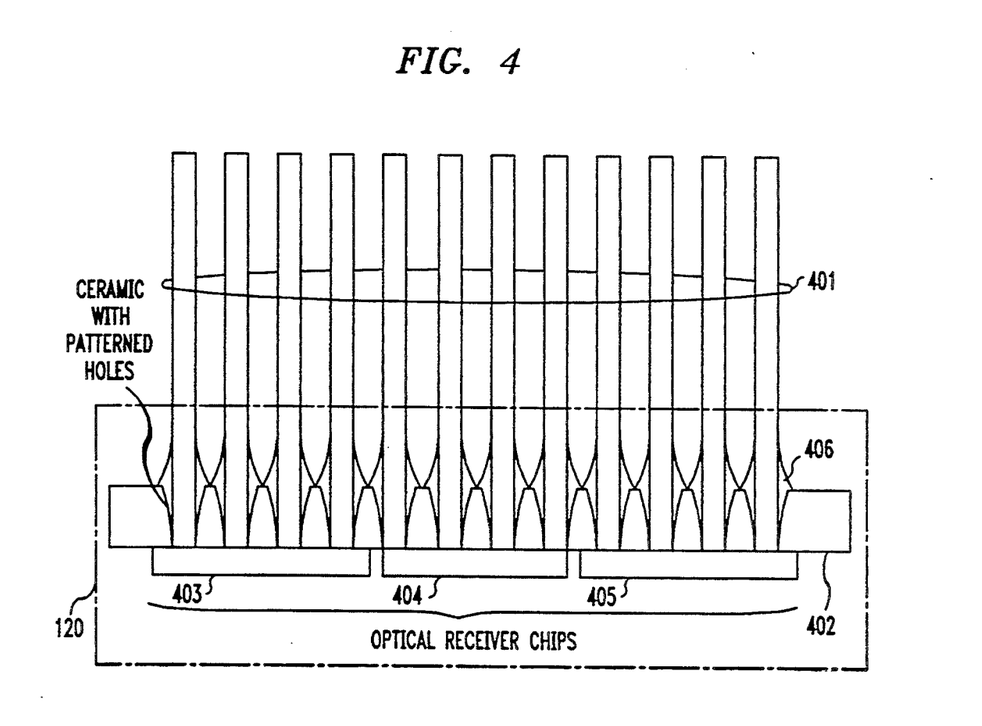
FIG. 4 shows the details of the connection arrangement of FIG. 3.

With reference to FIG. 4 we show the details of how a multifiber ribbon cable 401 interconnects to a multichip module 120. Holes formed in substrate 402 enable each of the fibers of the ribbon cable 401 to pass through substrate 402 and reach several of the optoelectronic chips 403, 404 and 405. (For convenience, the mounting of these chips 403–405 to substrate 402 has not been shown.) The optical fiber ribbon cable 401 is fixed to the substrate 402 using epoxy 406.

Figure 5:
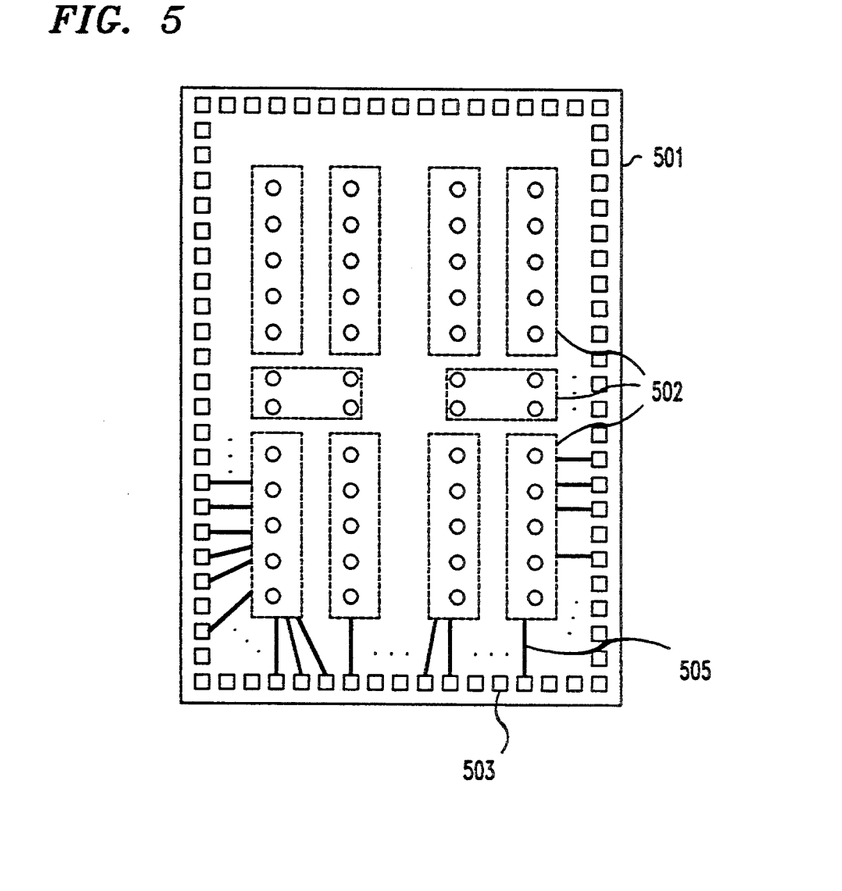
FIG. 5 shows a top down view of a substrate having optical fiber holes.

Shown in FIG. 5 is a top down view of a substrate of the multichip module showing the holes that are used to receive the optical fibers. Also shown is an illustrative arrangement of optoelectronic chips 502 as well as the illustrative wiring paths which interconnect these optoelectronic chips and electrical pads of the multichip module 120.

Holes may be formed in substrate 501, using precision drilling or by etching photo-definable ceramics. Recently, there have been improvements in the quality, size and cost of photo-definable ceramics. One such ceramic is Fotoform ™, made by Corning Glass, which is currently used in high volume production of glass, opal, and ceramic ornaments as well as precision parts used in ink jet printers. In its unprocessed state, the material is shadow masked (note that there is no photoresist used) and illuminated with ultraviolet light in a well-known manner. The illuminated regions are etched in a hydrofluoric HF bath at a rate 40 times the rate on the un-illuminated regions giving a characteristic 2.5° etching angle. This etching angle 608 causes a taper in holes etched in the ceramic which can be formed from both sides of the ceramic, (shown in FIG. 6) or a single side as (shown in FIG. 7).

Replacing the multichip module (MCM) substrate 123 material of FIG. 2 with a photo definable ceramic (PDC) allows for additional functionality of MCMs and a whole new class of optoelectronic device opportunities. Most optical fiber used in a single fiber cable or in fiber ribbon has a diameter of 125 µm and are quite accurate in their alignment of the center of the fiber core with the center of the outside cladding. Holes can be etched in the PDC such that the minimum diameter of the holes on one of the two surfaces is 125 µm. At this point, the PDC is processed in exactly the same manner as the current alumina MCM substrate. Interconnection lines and bonding pads are fabricated onto the surface followed by pick and place attachment of the required discrete and chip components. Since the holes are etched in the material with the use of photolithographic masks, mating optoelectronic chips (e.g., 403–405) can easily be defined and fabricated in Si or III/V materials. The optoelectronic detectors and emitters (e.g., 403–405) may then be accurately placed over the holes with active regions facing towards the substrate 402. Fibers 401 are then inserted into these holes with the taper used to guide the fiber tip to its final precise location.

Alignment precision in the substrate plane is ensured between the optoelectronic devices (403–405) and the optical fiber (401) by the use of matched photolithographic masks for the PDC piece, the electrical interconnection network placed on substrate 402 and the optoelectronic device (e.g. 403–405) itself together with the self-aligning behavior of the solder reflow and the Fotoform etching accuracy.

Alignment in the z direction (see FIG. 6) is not quite as easy nor is the required tolerance as high. There are several methods proposed to provide the z-axis alignment. If one can precisely cleave the optical fiber or fiber ribbon (as is possible with optical fiber but not quite as advanced for fiber ribbon) then the method of FIG. 7 is acceptable. The method, shown in FIG. 7, requires the use of a physical stop on the optoelectronic chip (or device) 702 itself. As the fiber 705 is inserted into the PDC hole 706, it stops when it touches the device 702 and is then epoxied in place. Because the fiber may damage circuits on the device, the stop locations on the device will need to be void of circuitry. Another method shown in FIG. 6 uses a duplicate PDC substrate 600 as a dummy plate 610. This alignment technique is the subject of our previously-filed patent application entitled "Optical Fiber Connective Device and Its Method of Assembly". This method is briefly described below. Fiber 605 is inserted through both plate 610 and a dummy substrate (similar to substrate 600). The ends of the optical fiber 605 are then cleaved at the top surface of the dummy substrate (not shown). The fiber 605 is then polished and epoxied to the plate 610. Thereafter the plate 610 with mounted fiber 605 is removed front the dummy substrate and inserted into PDC substrate 600 with the z-axis positioning now precisely aligned.

Figure 6:
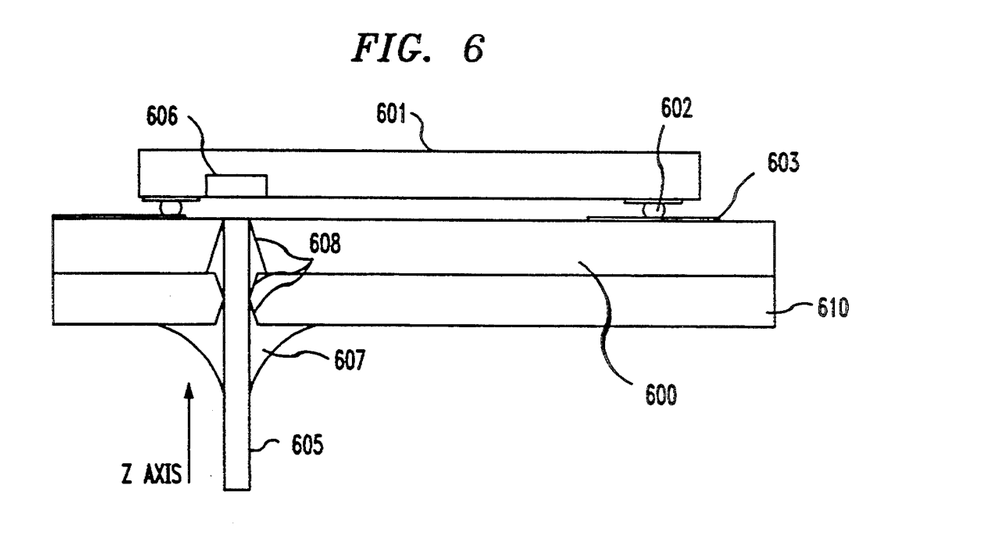
FIGS. 6–8 show details of various optical fiber interconnections to optoelectronic chips.
Figure 7:
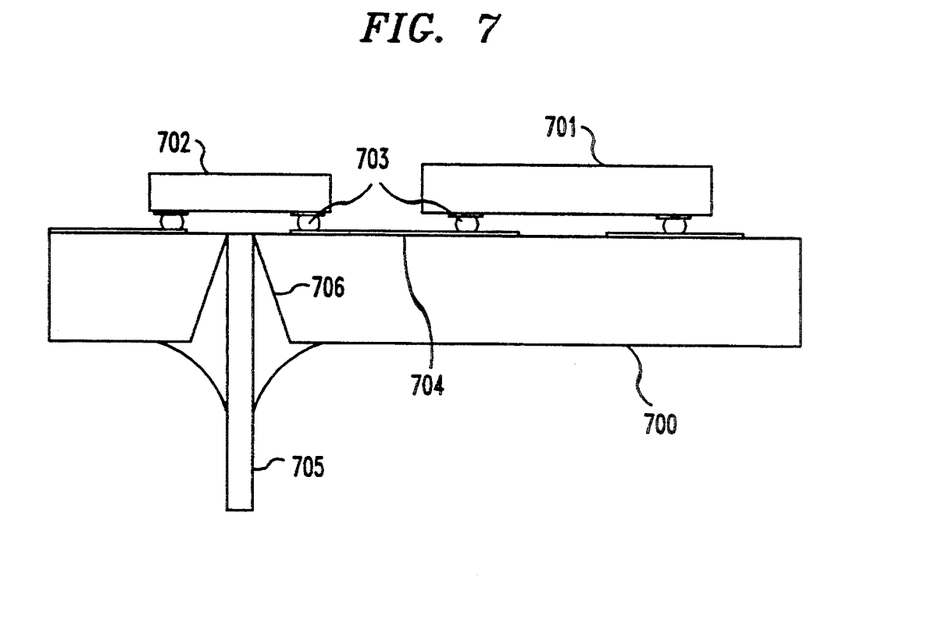
Figure 8:
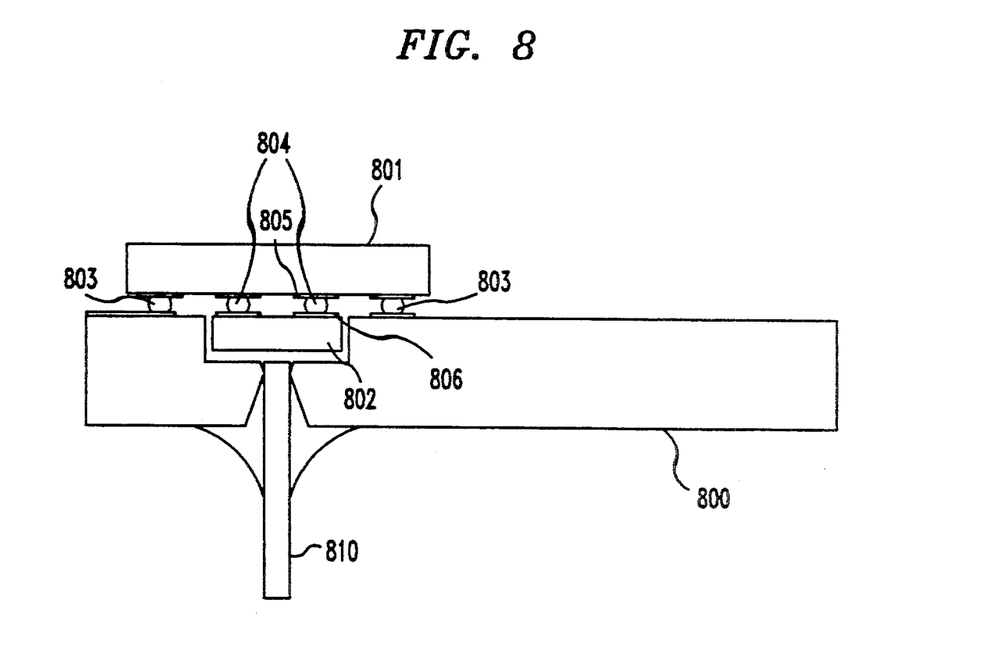

The placement of receiver or transmitter optoelectronic chips on a multichip module can take many different forms as illustrated in FIGS. 6–8. In FIG. 6, the silicon chip 601 is positioned directly over the optical fiber 605 and a photo detector or photo transmitter 606 is integrated into the silicon chip 601. Although today it is not practical to integrate a photo transmitter onto a silicon chip, it is expected that it will be possible in the future. Efficient photo detectors are difficult to fabricate on silicon VLSI chips which are confined to CMOS-type processing. In the arrangement of FIG. 6 optical signals are inputted or outputted over optical fiber 605 and coupled to a photo detector or photo transmitter 606. The electrical signals into photo detector or from photo transmitter 606 are processed by electronic circuitry on silicon chip 601. Other input and output electrical signals are connected to silicon chip 601 via wire paths and contact bonds 603 and solder bumps 602.

Shown in FIG. 7 is another embodiment for interconnecting optical signals from optical fiber 705 to circuitry mounted on substrate 700. The arrangement of FIG. 7 is a hybrid approach which preferably enables the circuit to detect wavelength of light that is not possible using existing silicon detectors. A discrete optoelectronic chip 702 of GaAs or InP (with various epilayer structures) can be separately bonded to ceramic substrate 700. In this arrangement the chip 702 is solder bonded 703, to contact pad and wire pad 704 to silicon chip 701 (which includes clock recovery and processing circuitry). The chip 702 is aligned and solder bonded over the optical fiber 705 to insure efficient optical signal coupling.

With reference to FIG. 8 we describe an alternative arrangement where the detector chip 802 is itself flip-chip bonded to the silicon integrated circuit 801 which is then flip-chip bonded onto ceramic substrate 800. In this arrangement optical signals are received or transmitted over optical fiber 810 and coupled to detector or transmitter 802 which converts them to electrical signals. The electrical signals out of chip 802 are coupled over wire path 806 to solder bond 804 to wire path 805 on the silicon integrated circuit 801 which processes the receive or transmitted signal. The silicon integrated circuit 801 is itself connected via wire paths 805 and solder bonds 803 to wire paths 804 of ceramic substrate 800.

In the illustrated multichip module designs (FIGS. 2–4) the optical fiber and optical fiber ribbon cable connects perpendicular to the PC board surface. This may be undesirable since PC circuit boards are placed in racks close to each other with the I/O being confined to the boards. There are two designs which can be adapted to this constraint while maintaining the advantages present in the optoelectronic module. The first (shown in FIGS. 9 and 10) have connection pins on only one side of the multichip module substrate which allows the substrate to reside orthogonal to the PC board. If single fibers are used for the interconnection, ST-type studs (ST is a type of optical fiber connector available from AT&T) can be epoxied to the back of the multichip module substrate for connection to standard single fiber multi-mode connectors as shown in FIG. 9.

Figure 9:
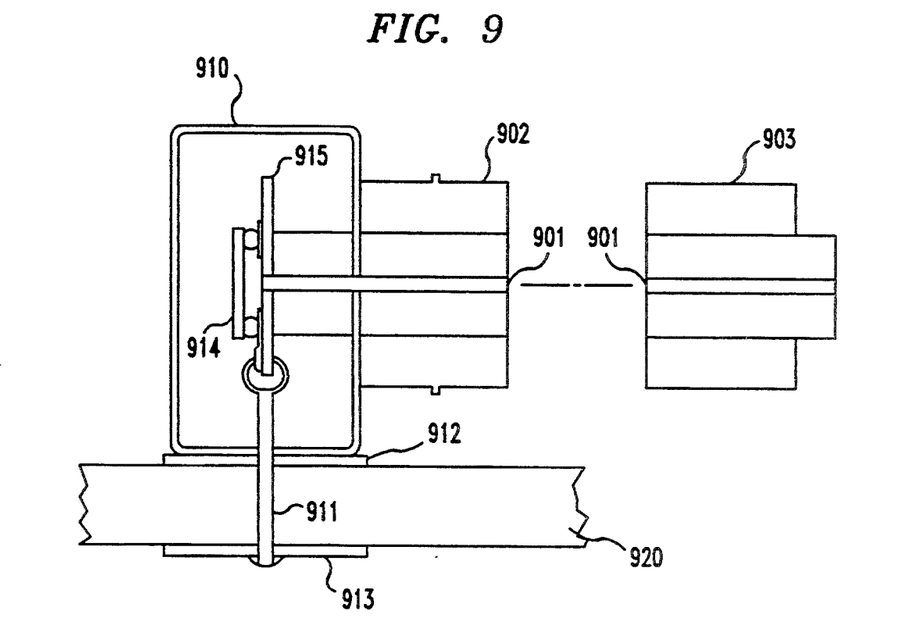
FIG. 9 shows an optical fiber connector for a printed circuit board.

FIG. 9 shows the details of an optical fiber connector for a printed circuit board. The signal optical fiber connector 910 may connect to an optical fiber itself 901 or may connect via an optical fiber connector stub 902. If the optical fiber connector 910 has, illustratively, an ST-type stub on it, it connects to a mating ST-type connector on an optical fiber cable 903. Many connector arrangements are known to interconnect optical fiber cables. The optical fiber connector 910 also includes a conductive external pin (or terminals) 911 which enables a solder connection to wire paths 912 or 913 on PC board 901. The connection of optical fiber 901 to optoelectronic chip 914 mounted on multichip nodule 915 is accomplished using any of the previously-described arrangements shown in FIGS. 6–8. The components of optical fiber connector 910 are then sealed in a plastic package. The pin 911 can be ,arranged to plug into a connector or to be soldered to contact pads on substrate 915.

Figure 10:
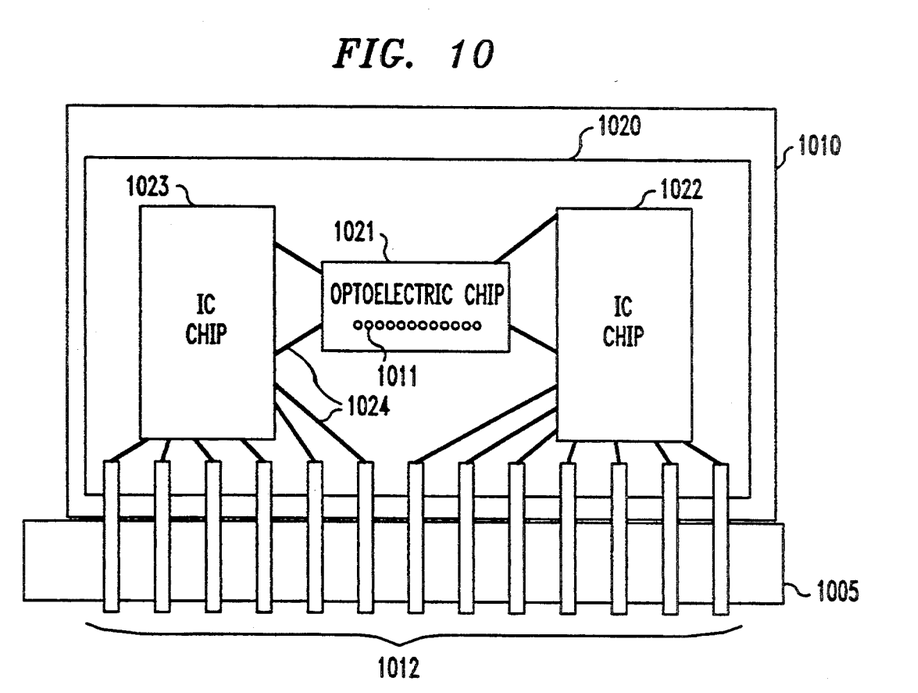
FIG. 10 shows an optical fiber ribbon cable connector for insertion in a printed circuit board.

Shown in FIG. 10 is an optical fiber ribbon cable connector for use with a printed circuit board. The ribbon cable connector 1010 enables each optical fiber of the cable to connect to individual external conductor pins (or terminals). The optical fiber ribbon cable connector 1010 includes a multichip module having a substrate 1020 onto which is bonded photo detectors or photo transmitter chips 1021 and silicon processing circuit chips 1022 and 1023. Wire paths 1024 interconnect the silicon processing circuit chips 1022 to the receiver and transmitter chips 1021 and also to external conductor pins 1012.

Figure 11A:
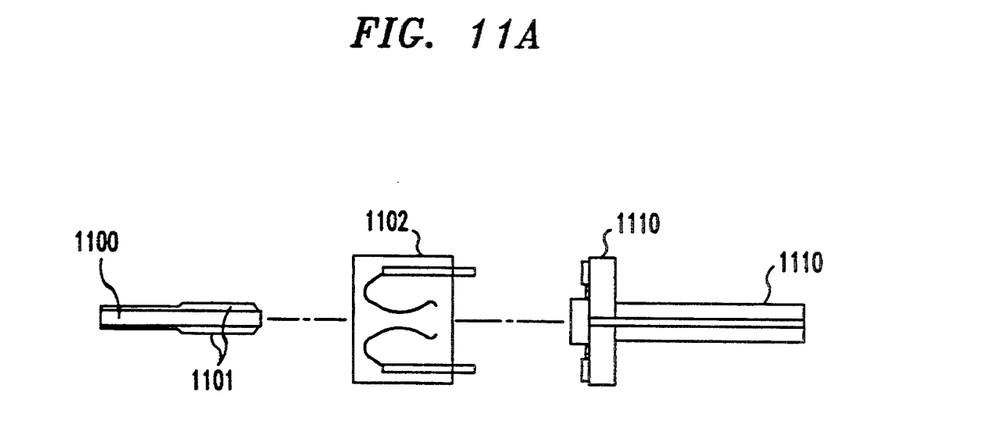
FIGS. 11a and 11b show the construction of an optical fiber edge connector and its connection to the contacts of a printed circuit board.
Figure 11B:
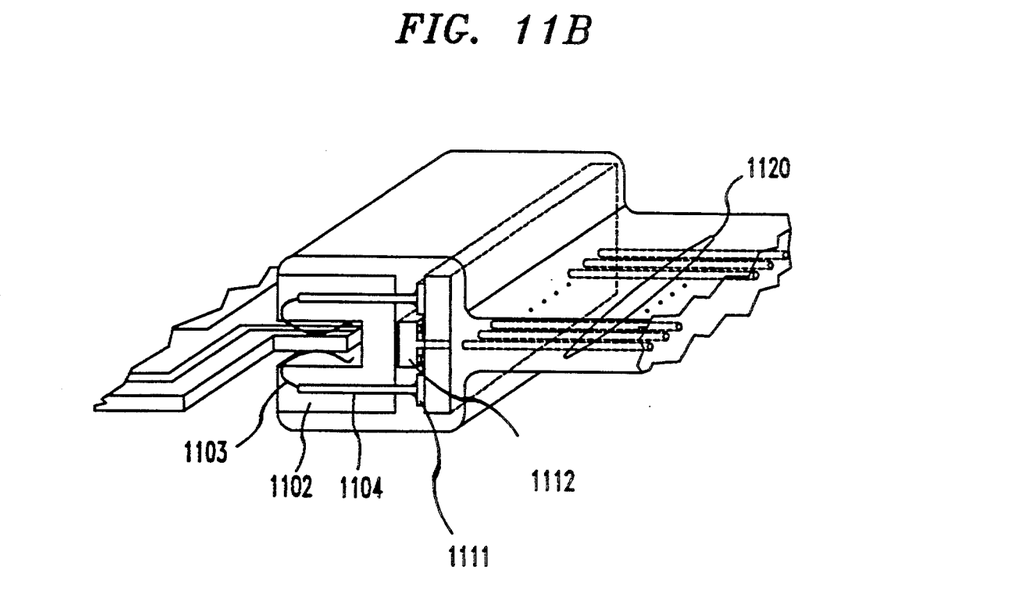

If one desires the high speed, interference free, ground-loop free features associated with optical interconnection for PC-board to PC-board applications then a smart connector is an attractive solution. In many ways it offers the best of both electronics and optics. The smart connector is shown in FIGS. 11a and 11b. Electronics is good at processing and amplification. Optics is not. Electrical connectors have been successfully engineered to provide low-cost, repeatable connections and are relatively immune to cleanliness issues. Optical connectors are expensive and need to be cleaned regularly. Long electrical interconnections are power-hungry and sensitive to electromagnetic interference, crosstalk and ground loops. Long optical interconnections are not. By placing the electrical drivers inside the smart connector package, the smart connector provides an optical interconnection solution with low power CMOS or TTL level inputs. The use of electrical connectors to provide the attachment to the board would solve the alignment and cleanliness issues which are paramount when one tries to provide optical interconnection on a PC-board edge.

FIGS. 11a and 11b show the construction details of an optical fiber edge connector and its connection to the contacts of a printed circuit board. Shown in FIG. 11a are the components used to construct an optical fiber edge connector. Electrical connector 1102 houses spring contacts 1103 which enable electrical connector 1102 to connect to contacts 1101 on the edge of circuit board 1100. Connector pins 1104 connect to spring contacts 1103. The multichip module 1110 includes contact pads 1111, wiring pads 1112, optoelectronic chip and processing chips together shown as 1113 which are mounted on substrate 1114. Optical fiber ribbon 1120 connects to multichip module 1110 in the manner as previously described. Electrical connector 1102 is then connected to contact pads 1111 on the multichip module. While the electrical connector is shown as a "female" connector, obviously it may be constructed to be a "male" connector which can be plugged into a mating female connector. FIG. 11b illustrates electrical connector 1102 and multichip module 1110 after they are encapsulated in a plastic housing thereby forming the optical fiber edge connector.

While the substrate material has been described as being glass or ceramic, other photolithographically fabricated materials, such as semiconductor materials, may be utilized.

What has been described is merely illustrative of the application of the principles of the present invention. Other arrangements and methods can be implemented by those skilled in the art without departing from the spirit and scope of the present invention.

What is claimed is:

1. Opto/electrical connector apparatus for interconnecting an optical fiber to one or more external electrical pins of the connector apparatus, comprising
   a substrate having a plurality of electrical paths including contact pads photolithographically defined on a first surface thereof for mounting at least one flip-chip type optoelectronic component, said substrate including a photolithographically defined hole formed between a second surface and said first surface of said substrate, said hole and said contact pads being defined by matched photolithographic masks to achieve a predetermined alignment precision therebetween, said hole being used to accept said optical fiber;
   said optical fiber mounted through said hole in said substrate for coupling an optical signal directly to a surface of an optoelectronic component;
   said at least one optoelectronic component including on a first surface thereof a plurality of contact pads for mounting to matching contact pads on said plurality of electrical paths resulting in said optoelectronic component being aligned over said hole to enable the communicating of an optical signal to and from said optical fiber and
   said one or more external electrical pins having a first portion mounted on the first surface of said substrate and a second portion extending external to said connector apparatus for enabling direct external electrical contact to one or more electrical paths of said substrate for communicating electrical signals to and from said at least one optoelectronic component.

2. The connector apparatus of claim, 1 wherein
   each of said one or more external electrical pins are arranged, respectively, to make connection with one or more contacts of a printed wiring board.

3. The connector apparatus of claim 1 wherein
   said one or more external electrical pins align with said substrate orthogonal to said optical fiber mounting to said substrate.

4. The connector apparatus of claim 1 wherein
   said one or more external electrical pins and said optical fiber form an in-line connector.

5. The connector apparatus of claim 2 wherein
   the second portion of said one or more external electrical pins is arranged to be soldered to the printed wiring board.

6. The connector apparatus of claim 2 wherein
   the second portion of said one or more external electrical pins includes a spring-contact section which enables electrical connection with one or more contacts of the printed wiring board.

* * * * *